United States Patent
Lo et al.

(10) Patent No.: US 9,577,154 B2
(45) Date of Patent: Feb. 21, 2017

(54) LIGHT EMITTING CHIP

(71) Applicant: Genesis Photonics Inc., Tainan (TW)

(72) Inventors: Yu-Yun Lo, Tainan (TW); Yi-Fan Li, Tainan (TW); Chih-Ling Wu, New Taipei (TW); Yi-Ru Huang, Tainan (TW); Jing-En Huang, Tainan (TW); Shao-Ying Ting, Tainan (TW)

(73) Assignee: Genesis Photonics Inc., Tainan (TW)

( * ) Notice: Subject to any disclaimer, the term of this patent is extended or adjusted under 35 U.S.C. 154(b) by 92 days.

(21) Appl. No.: 14/535,333

(22) Filed: Nov. 7, 2014

(65) Prior Publication Data

US 2015/0188014 A1 Jul. 2, 2015

(30) Foreign Application Priority Data

Dec. 30, 2013 (TW) .............................. 102149040 A

(51) Int. Cl.
| | |
|---|---|
| *H01L 21/00* | (2006.01) |
| *H01L 33/40* | (2010.01) |
| *H01L 33/44* | (2010.01) |
| *H01L 33/42* | (2010.01) |

(52) U.S. Cl.
CPC .............. *H01L 33/40* (2013.01); *H01L 33/42* (2013.01); *H01L 33/44* (2013.01)

(58) Field of Classification Search
CPC ........ H01L 33/38; H01L 33/005; H01L 33/60; H01L 33/0079; H01L 33/405; H01L 33/46; H01L 33/56; H01L 33/502; H01L 33/501; H01L 2933/0058; H01L 2933/0025; H01L 2933/0033; C09K 11/04

USPC .................... 257/88, 99, 84, 79, 98, 81, 100

See application file for complete search history.

(56) References Cited

U.S. PATENT DOCUMENTS

2014/0227813 A1* 8/2014 Yoneda ............... H01L 33/0095
438/33

FOREIGN PATENT DOCUMENTS

| TW | 200532936 | 10/2005 |
| TW | 200834969 | 8/2008 |
| TW | 201130164 | 9/2011 |
| TW | 201312813 | 3/2013 |
| TW | 201344957 | 11/2013 |

OTHER PUBLICATIONS

"Office Action of Taiwan Counterpart Application", issued on Aug. 13, 2015, p. 1-p. 7, in which the listed references were cited.

* cited by examiner

*Primary Examiner* — Hoa B Trinh
(74) *Attorney, Agent, or Firm* — Jianq Chyun IP Office

(57) ABSTRACT

A light emitting chip includes a light emitting unit, a eutectic layer and a surface passivation layer. The eutectic layer has a first surface and a second surface opposite to each other. The light emitting chip connects to the first surface of the eutectic layer. The surface passivation layer covers the second surface of the eutectic layer. A material of the surface passivation layer includes at least a metal of an oxidation potential from −0.2 volts to −1.8 volts.

16 Claims, 6 Drawing Sheets

LIGHT EMITTING CHIP

CROSS-REFERENCE TO RELATED APPLICATION

This application claims the priority benefit of Taiwan application serial no. 102149040, filed on Dec. 30, 2013. The entirety of the above-mentioned patent application is hereby incorporated by reference herein and made a part of this specification.

BACKGROUND OF THE DISCLOSURE

1. Field of the Disclosure

The disclosure is related to a light emitting chip and more particularly to a light emitting diode chip.

2. Description of Related Art

Along with the development of optoelectronic technology, thanks to numerous advantages of long life span, miniature size, high vibration and shock resistance, low heat emissivity, economical power consumption and so on, light emitting diodes (LEDs) have been widely applied to indicating lights or light sources employed in a variety of household electric appliances and instruments. When the metal eutectic bonding method is used to electrically connect with other components (e.g., substrate) in the conventional LED, a eutectic material layer of a metal alloy is formed on the electrodes of the LED, for example, a eutectic material layer consisting gold tin alloy with 80 wt % of gold and 20 wt % of tin, and the gold tin alloy may reach a low melting point eutectic temperature about 280 degree Celsius. However, the eutectic material layer having a low melting point likely gives rise to oxidation after contacts with air, and thus affects the electrical property and bonding strength of LED.

SUMMARY OF THE DISCLOSURE

The disclosure provides a light emitting chip which has a surface passivation layer covering the eutectic layer and is capable to prevent the eutectic layer from giving rise to oxidation, so as to increase the bonding strength.

The light emitting chip of the disclosure includes a light emitting unit, a eutectic layer and a surface passivation layer. The eutectic layer has a first surface and a second surface opposite to each other. The light emitting unit is connected to the first surface of the eutectic layer. The surface passivation layer covers the second surface of the eutectic layer. The material of the surface passivation layer includes at least a metal of an oxidation potential from −0.2 volts to −1.8 volts.

According to an exemplary embodiment of the disclosure, the material of the surface passivation layer is selected from the group consisting gold (Au), platinum (Pt), gold alloy, platinum alloy, and a combination thereof.

According to an exemplary embodiment of the disclosure, the material of the surface passivation layer is gold having a purity level larger than 99.9 wt %.

According to an exemplary embodiment of the disclosure, the thickness of the surface passivation layer ranges from 1 nm to 1000 nm.

According to an exemplary embodiment of the disclosure, the thickness of the surface passivation layer ranges from 5 nm to 100 nm.

According to an exemplary embodiment of the disclosure, the ratio of the thickness of the eutectic layer to the thickness of the surface passivation layer ranges from 10 to 10000.

According to an exemplary embodiment of the disclosure, the material of the eutectic layer is a eutectic alloy consisting at least two materials selected from tin (Sn), indium (In), silver (Ag), and bismuth (Bi).

According to an exemplary embodiment of the disclosure, the light emitting unit includes a semiconductor epitaxial layer, a first electrode and a second electrode. The semiconductor epitaxial layer includes a first type semiconductor layer, a light emitting layer and a second type semiconductor layer. The first electrode is disposed on the first type semiconductor layer and electrically connected with the first type semiconductor layer. The second electrode is disposed on the second type semiconductor layer and electrically connected with the second type semiconductor layer.

According to an exemplary embodiment of the disclosure, the eutectic layer directly covers the first upper surface of the first electrode and the second upper surface of the second electrode.

According to an exemplary embodiment of the disclosure, the light emitting unit further includes a substrate, an insulating layer and a conductive structure layer. The semiconductor epitaxial layer is disposed on the upper surface of the substrate. The insulating layer is disposed between the first electrode and the semiconductor epitaxial layer and between the second electrode and the second type semiconductor layer, wherein a portion of the insulating layer is exposed between the first electrode and the second electrode. The conductive structure layer is disposed between the second type semiconductor layer and the insulating layer, wherein the second electrode is electrically connected to the conductive structure layer.

According to an exemplary embodiment of the disclosure, the material of the conductive structure layer is selected from the group consisting indium tin oxide, aluminum doped zinc oxide, indium zinc oxide, and a combination thereof.

According to an exemplary embodiment of the disclosure, the light emitting unit further includes a substrate having an upper surface and a lower surface opposite to each other, wherein the semiconductor epitaxial layer is disposed on the upper surface, and the eutectic layer covers the lower surface.

According to an exemplary embodiment of the disclosure, the eutectic layer covers a surface of the first electrode relatively away from the first type semiconductor layer.

According to an exemplary embodiment of the disclosure, the oxidation potential of the eutectic layer is larger than the oxidation potential of the surface passivation layer.

In light of the above, the light emitting chip of the disclosure has a surface passivation layer and the surface passivation layer covers the eutectic layer. As such, the eutectic layer is not easy to contact with air, the eutectic layer can prevent occurrence of an oxidation phenomenon, and so that the eutectic layer may maintain a superior electrical property and bonding ability. Accordingly, the light emitting chip of the disclosure may have favorable bonding strength.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
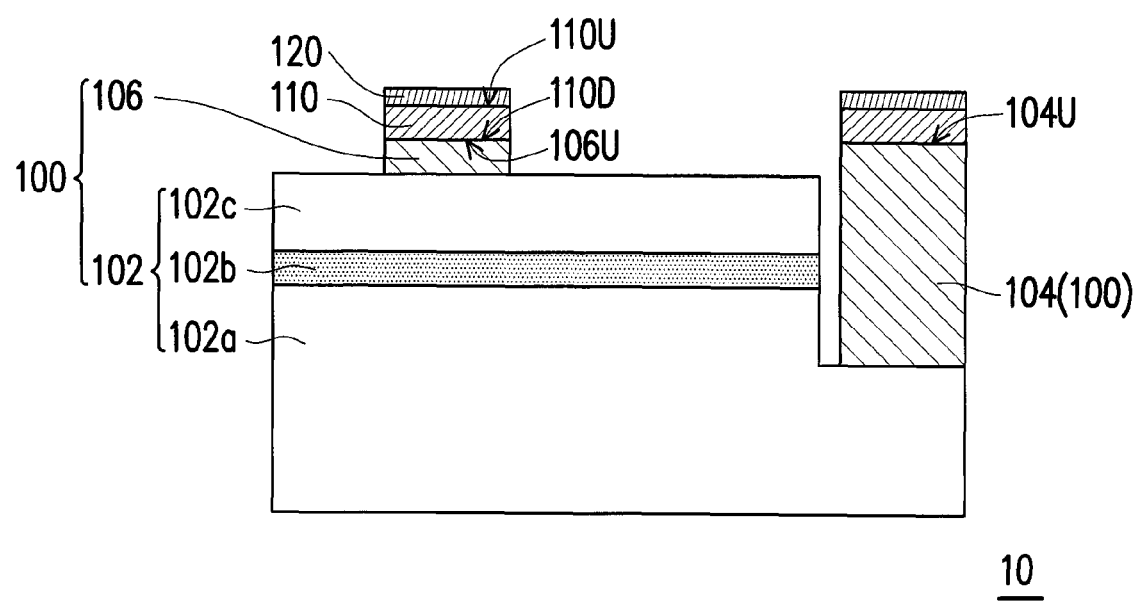
FIG. 1 is a cross-sectional schematic view of a light emitting chip in accordance with one embodiment of the disclosure.

FIG. 1 is a cross-sectional schematic view of a light emitting chip in accordance with one embodiment of the disclosure. Referring to FIG. 1, in the embodiment, the light emitting chip 10 includes a light emitting unit 100, a eutectic layer 110 and a surface passivation layer 120. The eutectic layer 110 has a first surface 110D and a second surface 110U opposite to each other. The light emitting unit 100 is connected to the first surface 110D of the eutectic layer 110. The surface passivation layer 120 covers the second surface 110U of the eutectic layer 110. The material of the surface passivation layer 120 includes at least a metal of an oxidation potential from −0.2 volts to −1.8 volts.

Specifically, in the embodiment, the thickness of the surface passivation layer 120 ranges from 1 nm to 1000 nm. It should be mentioned that, if the thickness is smaller than 1 nm, then the ability that the surface passivation layer 120 prevents the eutectic layer 110 from occurring oxidation phenomenon may decline; if the thickness is larger than 1000 nm, then the surface passivation layer 120 may become too thick to be in a melted status for bonding with the eutectic layer 110, thus the bonding ability of the follow-up eutectic bonding process may further be affected. Preferably, the thickness of the surface passivation layer 120 ranges from 5 nm to 100 nm. Herein, the material of the surface passivation layer 120 may be a metal alloy, for example gold alloy or platinum alloy; or a single metal, such as gold or platinum. In the embodiment, the material of the surface passivation layer 120 is gold having a purity level larger than 99.9 wt %, preferably. In other words, all the materials used in the surface passivation layer 120 of the embodiment may belong to inert metal which may have a lower activity and prevent the eutectic layer 110 to occur oxidation phenomenon. As shown in FIG. 1, the surface passivation layer 120 and the eutectic layer 110 are specifically conformably disposed, and the periphery of the surface passivation layer 120 and the periphery of the eutectic layer 110 are substantially flush.

Moreover, the material of the eutectic layer 110 is a eutectic alloy consisting at least two materials selected from tin (Sn), indium (In), silver (Ag), and bismuth (Bi). For example, the eutectic layer 110 may be bismuth-tin alloy, indium-tin alloy, or tin-indium-silver alloy. Herein, preferably, the melting point of the eutectic layer 110 may range from 90 degree Celsius to 350 degree Celsius. Herein, the oxidation potential of the eutectic layer 110 is larger than the oxidation potential of the surface passivation layer 120.

Especially, in the embodiment, the ratio of the thickness of the eutectic layer 110 to the thickness of the surface passivation layer 120 ranges from 10 to 10000. It should be mentioned that, if the ratio of the thickness of the eutectic layer 110 to the thickness of the surface passivation layer 120 is smaller than 10, then it means that the thickness of the surface passivation layer 120 is too thick to be in a melted status for bonding with the eutectic layer 110, thus the bonding effect of the follow-up eutectic bonding process may further be affected; if the ratio of the thickness of the eutectic layer 110 to the thickness of the surface passivation layer 120 is larger than 10000, then it means that the thickness of the surface passivation layer 120 is too thin, and the ability that prevents the eutectic layer 110 from occurring oxidation phenomenon may decline. In more detailed, in the embodiment, the optimum ratio of the thickness of the eutectic layer 110 to the thickness of the surface passivation layer 120 ranges from 100 to 1000.

Referring to FIG. 1, in the embodiment, the light emitting unit 100 specifically includes a semiconductor epitaxial layer 102, a first electrode 104 and a second electrode 106. The semiconductor epitaxial layer 102 includes a first type semiconductor layer 102a, a light emitting layer 102b and a second type semiconductor layer 102c which are sequentially stacked. The first electrode 102 is disposed on the first type semiconductor layer 102a and contact with the first type semiconductor layer 102a, wherein the first electrode 104 and the first type semiconductor layer 102a are electrically connected, and the material thereof may preferably be selected from a group consisting chromium (Cr), platinum (Pt), gold (Au), aluminum (Al), tin (Sn), an alloy thereof, and a combination thereof. The second electrode 106 is disposed on the second type semiconductor layer 102c and contact with the second type semiconductor layer 102c, wherein the second electrode 106 and the second type semiconductor layer 102c are electrically connected. The light emitting layer 102b covers a portion of the first type semiconductor layer 102a and is disposed between the first type semiconductor layer 102a and the second type semiconductor layer 102c.

In the embodiment the eutectic layer 110 directly and entirely covers the first upper surface 104U of the first electrode 104 and the second upper surface 106U of the second electrode 106, and the surface passivation layer 120 and the eutectic layer 110 are conformably disposed. Thus, the surface passivation layer 120 may effectively let the second surface 110U of the eutectic layer 110 not to easily contact with air, the eutectic layer 110 occurring an oxidation phenomenon may be prevented, and so that the eutectic layer 110 may maintain a superior electrical property and bonding ability. Accordingly, the light emitting chip 10 of the disclosure may have favorable bonding strength. Herein, as shown in FIG. 1, the light emitting chip 10 of the embodiment is exemplarily illustrated as a flip chip light emitting diode, thus the first upper surface 104U of the first electrode 104 and the second upper surface 106U of the second electrode 106 are substantially flush, but the disclosure is not limited thereto.

It should be mentioned that, reference numerals the same as that of the above embodiment are used in the following embodiments to indicate similar components, and similar techniques will not be repeated herein any more, which can be obtained with reference to the content of the above embodiments. For a detailed description of the following embodiments, reference can be found in the aforementioned embodiment, and therefore no further description is contained herein.

Figure 2:
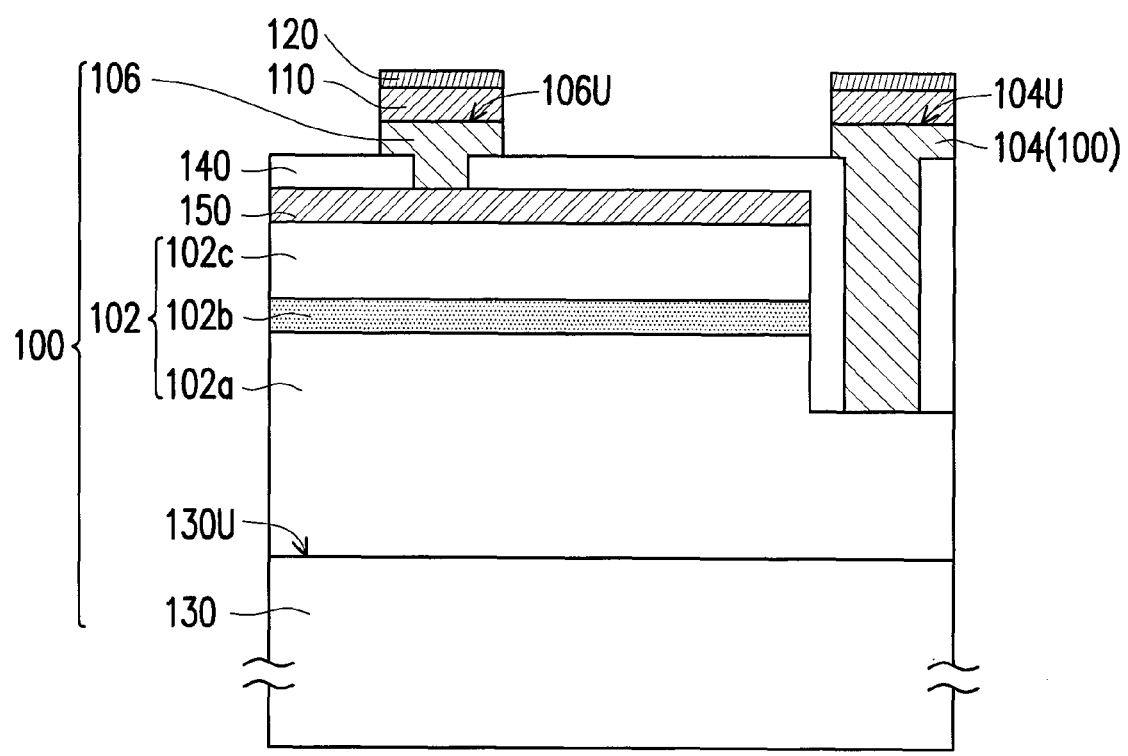
FIG. 2 is a cross-sectional schematic view of a light emitting chip in accordance with another embodiment of the disclosure.

FIG. 2 is a cross-sectional schematic view of a light emitting chip in accordance with another embodiment of the disclosure. Referring to FIG. 2, a structure of the light emitting chip 20 in this embodiment is similar to that of the light emitting chip 10 in FIG. 1, and the difference between the two is that the light emitting unit 100 further includes a substrate 130, an insulating layer 140 and a conductive structure layer 150.

In detailed, the semiconductor epitaxial layer 102 of the embodiment is disposed on the upper surface 130U of the substrate 130. The insulating layer 140 is disposed between the first electrode 104 and the semiconductor epitaxial layer 102 and between the second electrode 106 and the second type semiconductor layer 102c, wherein a portion of the insulating layer 140 is exposed between the first electrode 104 and the second electrode 106. The conductive structure layer 150 is disposed between the second type semiconductor layer 102c and the insulating layer 140, wherein the second electrode 106 is directly contact with the conductive structure layer 150. Herein, the material of the substrate 130 is, for example, sapphire, aluminum nitride or silicon carbide, but the disclosure is not limited thereto. The material of the conductive structure layer 150 is, for example, selected from the group consisting indium tin oxide, aluminum doped zinc oxide, indium zinc oxide, and a combination thereof, so that the current may uniformly flow. As shown in FIG. 2, the light emitting chip 20 of the embodiment is specifically a flip chip light emitting diode, but the disclosure is not limited thereto.

Figure 3:
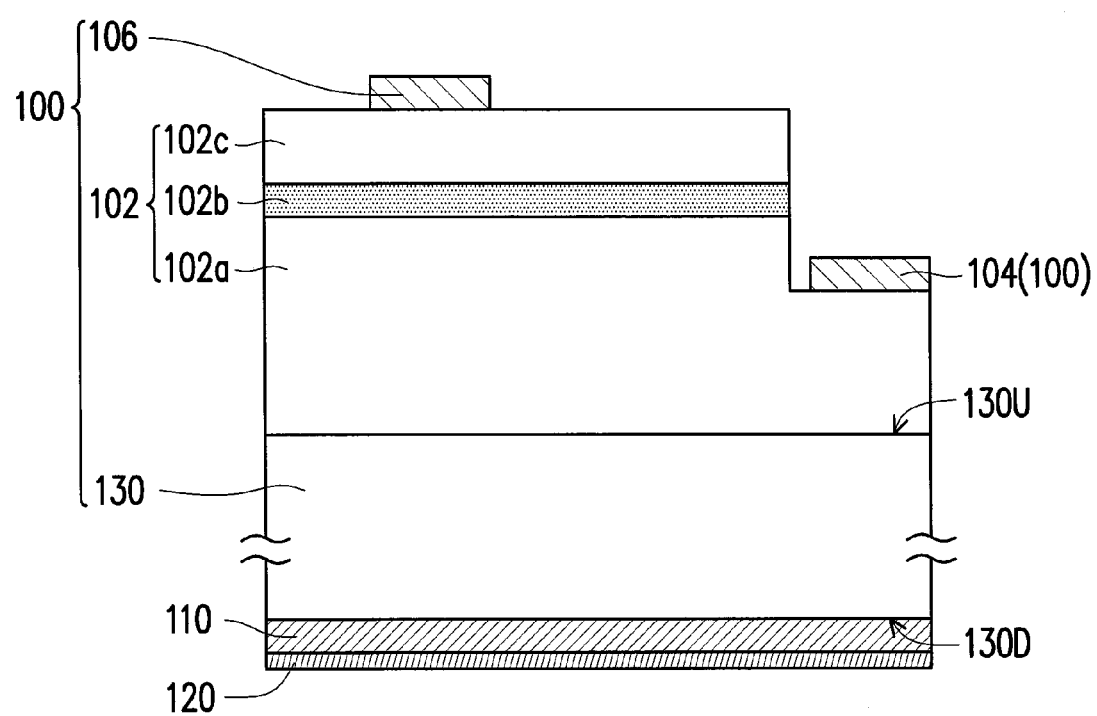
FIG. 3 is a cross-sectional schematic view of a light emitting chip in accordance with another embodiment of the disclosure.

FIG. 3 is a cross-sectional schematic view of a light emitting chip in accordance with another embodiment of the disclosure. Referring to FIG. 3, a structure of the light emitting chip 30 in this embodiment is similar to that of the light emitting chip 10 in FIG. 1, and the difference between the two is that the light emitting unit 100 of this embodiment further includes a substrate 130, and the semiconductor epitaxial layer 102 and the eutectic layer 110 are respectively disposed on the two opposite sides of the substrate 130. In detailed, the substrate 130 has an upper surface 130U and a lower surface 130D opposite to each other, wherein the semiconductor epitaxial layer 102 is disposed on the upper surface 130U of the substrate 130, the eutectic layer 110 covers the lower surface 130D of the substrate 130, and preferably, the eutectic layer 110 entirely covers the lower surface 130D of the substrate 130, so as to have a favorable bonding ability. Herein, the material of the substrate 130 is sapphire, aluminum nitride or silicon carbide, for example, but the disclosure is not limited thereto. As shown in FIG. 3, the light emitting chip 30 of the embodiment is specifically a horizontally oriented light emitting diode, but the disclosure is not limited thereto.

Figure 4:
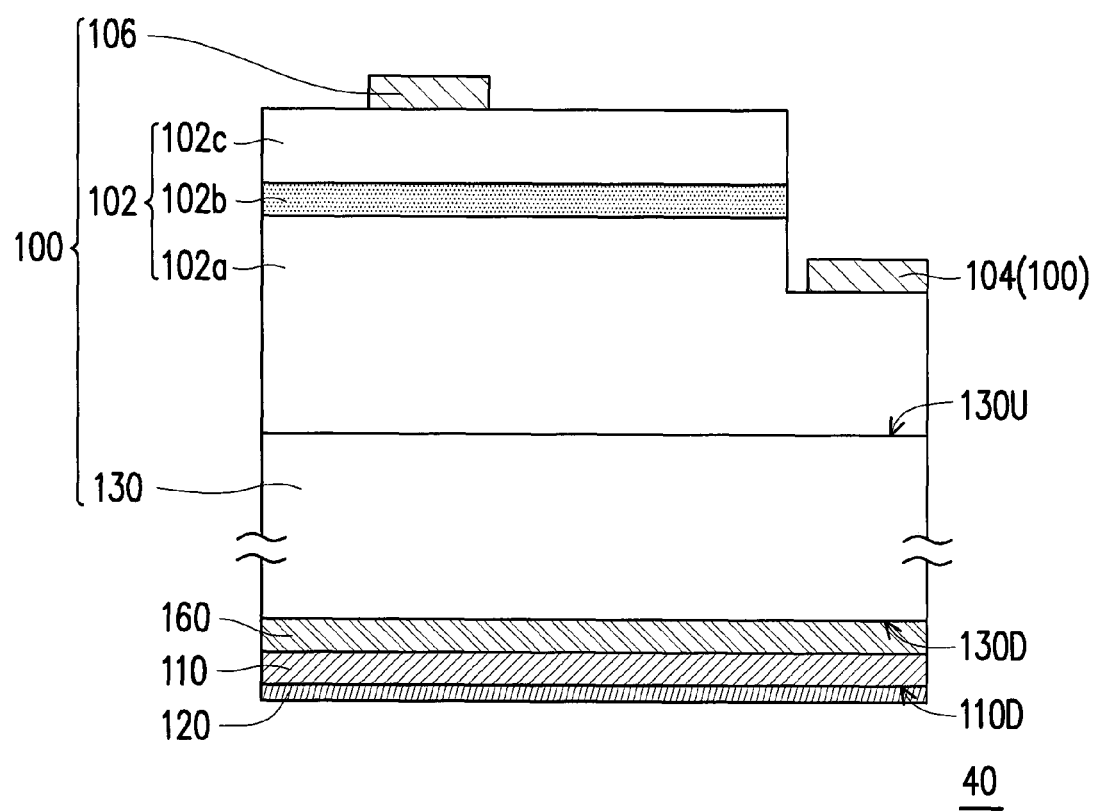
FIG. 4 is a cross-sectional schematic view of a light emitting chip in accordance with another embodiment of the disclosure.

FIG. 4 is a cross-sectional schematic view of a light emitting chip in accordance with another embodiment of the disclosure. Referring to FIG. 4, a structure of the light emitting chip 40 in this embodiment is similar to that of the light emitting chip 30 in FIG. 3, and the difference between the two is that the light emitting unit 40 of this embodiment further includes a reflective structure layer 160. In detailed, the reflective structure layer 160 is disposed between the substrate 130 and the eutectic layer 110, wherein the reflectivity of the reflective structure layer 160 is larger than 90%. Herein, the reflective structure layer 160 may be a distributed Bragg reflective mirror or a metal material layer, and the material may be a metal having a favorable reflectivity, such as silver, aluminum, gold, copper, chromium, nickel, platinum, and the like, and according to the design of reflective structure layer 160, a favorable reflective light emitting efficiency may be achieved. As shown in FIG. 4, the light emitting chip 40 of the embodiment is specifically a horizontally oriented light emitting diode, but the disclosure is not limited thereto.

Figure 5:
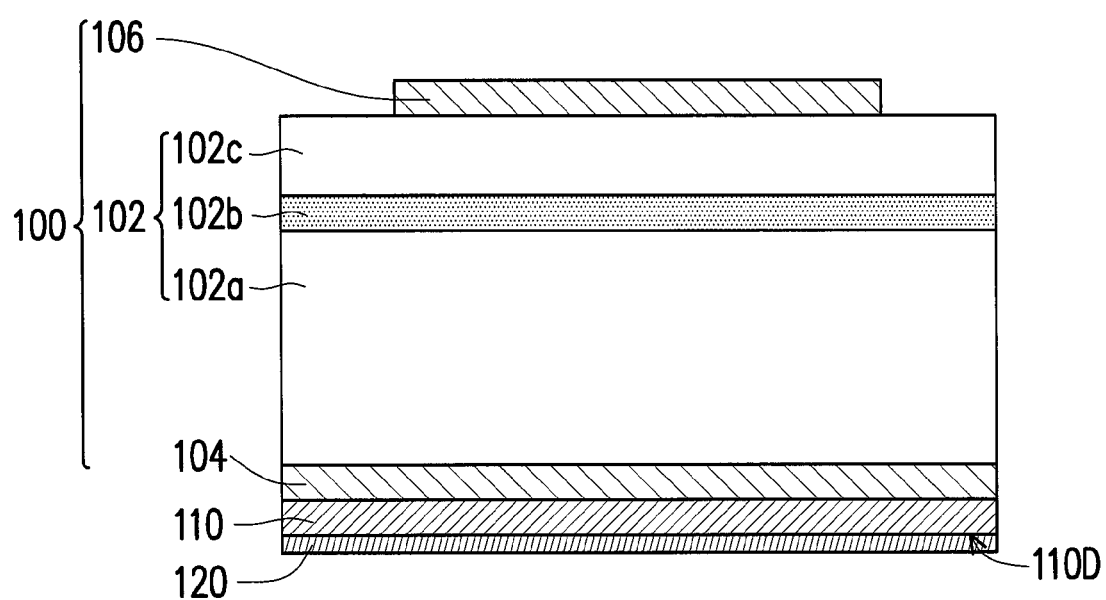
FIG. 5 is a cross-sectional schematic view of a light emitting chip in accordance with another embodiment of the disclosure.

FIG. 5 is a cross-sectional schematic view of a light emitting chip in accordance with another embodiment of the disclosure. Referring to FIG. 5, a structure of the light emitting chip 50 in this embodiment is similar to that of the light emitting chip 30 in FIG. 3, and the difference between the two is that in the light emitting unit 50 of this embodiment, the eutectic layer 110 covers a surface of the first electrode 104 relatively away from the first type semiconductor layer. To be detailed, in the embodiment, the first electrode 104 and the second electrode 106 are respectively located at the two opposite sides of the semiconductor epitaxial layer 102, and respectively electrically connected to the first type semiconductor layer 102a and the second type semiconductor layer 102c. The eutectic layer 110 and the surface passivation layer 120 are sequentially stacked on the first electrode 104. Herein, the first electrode 104, the eutectic layer 110 and the surface passivation layer 120 are substantially conformably disposed. As shown in FIG. 5, the light emitting chip 50 of the embodiment is specifically a vertically oriented light emitting diode.

Figure 6:
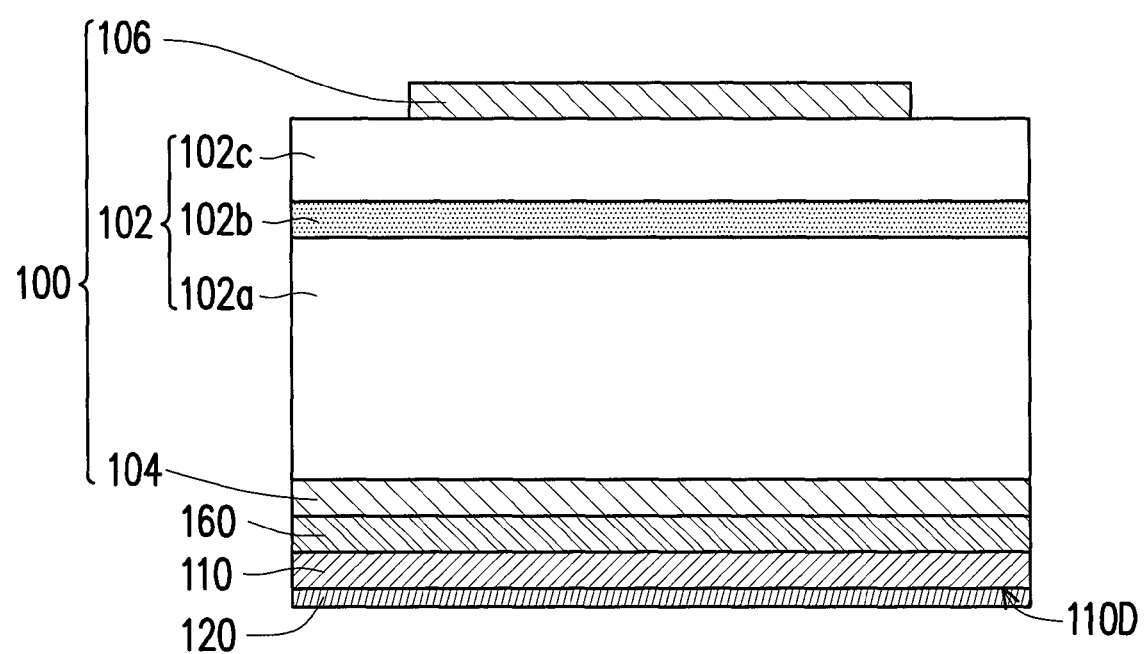
FIG. 6 is a cross-sectional schematic view of a light emitting chip in accordance with another embodiment of the disclosure.

FIG. 6 is a cross-sectional schematic view of a light emitting chip in accordance with another embodiment of the disclosure. Referring to FIG. 6, a structure of the light emitting chip 60 in this embodiment is similar to that of the light emitting chip 50 in FIG. 5, and the difference between the two is that the light emitting unit 60 of this embodiment further includes a reflective structure layer 160. In detailed, the reflective structure layer 160 is disposed between the first electrode 104 and the eutectic layer 110, wherein the reflectivity of the reflective structure layer 160 is larger than 90%. Herein, the reflective structure layer 160 may be a distributed Bragg reflective mirror or a metal material layer, and the material may be a metal having a favorable reflectivity, such as silver, aluminum, gold, copper, chromium, nickel, platinum, and the like. According to the design of reflective structure layer 160, a favorable reflective light emitting efficiency may be achieved. As shown in FIG. 6, the light emitting chip 60 of the embodiment is specifically a vertically oriented light emitting diode.

In light of the foregoing, the light emitting chip of the disclosure has a surface passivation layer which has a similar profile as the eutectic layer and the surface passivation layer covers the eutectic layer. As such, the eutectic layer is not easy to contact with air, the eutectic layer can prevent occurrence of an oxidation phenomenon, and so that the eutectic layer may maintain a superior electrical property and bonding ability. Accordingly, the light emitting chip of the disclosure may have favorable electrical property and bonding strength.

Although the disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:
1. A light emitting chip adapted to be electrically connected to an external substrate and comprising:

a light emitting unit, comprising first electrode and a second electrode;

at least one eutectic layer, electrically connected to at least one of the first electrode and the second electrode; and a surface passivation layer, covering the at least one eutectic layer, wherein the surface passivation layer is located between and connects the at least one eutectic layer and the external substrate.

2. The light emitting chip as claimed in claim 1, wherein a material of the surface passivation layer is selected from the group consisting gold, platinum, gold alloy, platinum alloy, and a combination thereof.

3. The light emitting chip as claimed in claim 1, wherein a material of the surface passivation layer is gold having a purity level larger than 99.9 wt %.

4. The light emitting chip as claimed in claim 1, wherein a thickness of the surface passivation layer ranges from 1 nm to 1000 nm.

5. The light emitting chip as claimed in claim 4, wherein said thickness of the surface passivation layer ranges from 5 nm to 100 nm.

6. The light emitting chip as claimed in claim 1, wherein a ratio of a thickness of the at least one eutectic layer to a thickness of the surface passivation layer ranges from 10 to 10000.

7. The light emitting chip as claimed in claim 1, wherein a material of the at least one eutectic layer is an eutectic alloy consisting at least two materials selected from tin, indium, silver, and bismuth.

8. The light emitting chip as claimed in claim 1, wherein the light emitting unit comprises:

a semiconductor epitaxial layer, comprising a first type semiconductor layer, a light emitting layer and a second type semiconductor layer;

a first electrode, disposed on the first type semiconductor layer, and electrically connected with the first type semiconductor layer; and a second electrode, disposed on the second type semiconductor layer, and electrically connected with the second type semiconductor layer.

9. The light emitting chip as claimed in claim 8, wherein the at least one eutectic layer directly covers a first upper surface of the first electrode and a second upper surface of the second electrode.

10. A light emitting chip, comprising:

a light emitting unit;

an eutectic layer, having a first surface and a second surface opposite to each other, wherein the light emitting unit connects to the first surface of the eutectic layer;

a surface passivation layer, covering the second surface of the eutectic layer, wherein a material of the surface passivation layer comprises at least a metal of an oxidation potential from −0.2 volts to −1.8 volts, wherein the light emitting unit further comprises:

a semiconductor epitaxial layer, comprising a first type semiconductor layer, a light emitting layer and a second type semiconductor layer;

a first electrode, disposed on the first type semiconductor layer, and electrically connected with the first type semiconductor layer;

a second electrode, disposed on the second type semiconductor layer, and electrically connected with the second type semiconductor layer, and the eutectic layer directly covers a first upper surface of the first electrode and a second upper surface of the second electrode;

a substrate, wherein the semiconductor epitaxial layer is disposed on an upper surface of the substrate;

an insulating layer, disposed between the first electrode and the semiconductor epitaxial layer and between the second electrode and the second type semiconductor layer, wherein a portion of the insulating layer is exposed between the first electrode and the second electrode; and a conductive structure layer, disposed between the second type semiconductor layer and the insulating layer, wherein the second electrode is electrically connected to the conductive structure layer.

11. The light emitting chip as claimed in claim 10, wherein a material of the conductive structure layer is selected from the group consisting indium tin oxide, aluminum doped zinc oxide, indium zinc oxide, and a combination thereof.

12. The light emitting chip as claimed in claim 8, wherein the light emitting unit further comprises:

a substrate, having an upper surface and a lower surface opposite to each other, wherein the semiconductor epitaxial layer is disposed on the upper surface, and the at least one eutectic layer covers the lower surface.

13. The light emitting chip as claimed in claim 8, wherein the at least one eutectic layer covers a surface of the first electrode relatively away from the first type semiconductor layer.

14. The light emitting chip as claimed in claim 1, wherein an oxidation potential of the at least one eutectic layer is larger than an oxidation potential of the surface passivation layer.

15. A light emitting chip adapted to be electrically connected to an external substrate and comprising:

a light emitting unit, comprising:

a semiconductor epitaxial layer, comprising a first type semiconductor layer, a light emitting layer, and a second type semiconductor layer;

a first electrode, disposed on the first type semiconductor layer and electrically connected with the first type semiconductor layer; and a second electrode, disposed on the second type semiconductor layer and electrically connected with the second type semiconductor layer;

a substrate, wherein the semiconductor epitaxial layer is disposed on an upper surface of the substrate;

an insulating layer, disposed between the first electrode and the semiconductor epitaxial layer and between the second electrode and the second type semiconductor layer, wherein a portion of the insulating layer is exposed between the first electrode and the second electrode; and a conductive structure layer, disposed between the second type semiconductor layer and the insulating layer, wherein the second electrode is electrically connected to the conductive structure layer;

at least one eutectic layer, having a first surface and a second surface opposite to each other, wherein the light emitting unit connects to the first surface of the at least one eutectic layer; and a surface passivation layer, covering the second surface of the at least one eutectic layer, wherein the surface passivation layer is located and connected between the at least one eutectic layer and the external substrate while the light emitting chip is connected to the external substrate, and the at least one eutectic layer is located between the first electrode and the surface passivation layer or between the second electrode and the surface passivation layer or a side of the first type semiconductor layer opposite to another side connected to the first electrode and the second electrode.

16. The light emitting chip as claimed in claim 15, wherein a material of the conductive structure layer is selected from the group consisting indium tin oxide, aluminum doped zinc oxide, indium zinc oxide, and a combination thereof.

* * * * *